United States Patent
Tay et al.

(10) Patent No.: US 8,420,447 B2
(45) Date of Patent: Apr. 16, 2013

(54) INTEGRATED CIRCUIT PACKAGING SYSTEM WITH FLIPCHIP LEADFRAME AND METHOD OF MANUFACTURE THEREOF

(75) Inventors: Lionel Chien Hui Tay, Singapore (SG); Henry Descalzo Bathan, Singapore (SG); Zigmund Ramirez Camacho, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/070,291

(22) Filed: Mar. 23, 2011

(65) Prior Publication Data

US 2012/0241928 A1    Sep. 27, 2012

(51) Int. Cl.
*H01L 21/50* (2006.01)
(52) U.S. Cl.
USPC ............... 438/123; 438/127; 257/701
(58) Field of Classification Search .......... 438/123, 438/124, 127; 257/787, 782, 784, 673
See application file for complete search history.

(56) References Cited

U.S. PATENT DOCUMENTS

| | | | | |
|---|---|---|---|---|
| 5,454,905 | A * | 10/1995 | Fogelson | 29/827 |
| 6,861,288 | B2 * | 3/2005 | Shim et al. | 438/109 |
| 7,443,043 | B2 * | 10/2008 | Sakamoto | 257/787 |
| 7,602,053 | B2 * | 10/2009 | Huang et al. | 257/676 |
| 7,638,861 | B2 * | 12/2009 | Choi et al. | 257/676 |
| 7,829,988 | B2 * | 11/2010 | Liu et al. | 257/678 |
| 8,193,037 | B1 * | 6/2012 | Bathan et al. | 438/111 |
| 8,203,201 | B2 * | 6/2012 | Camacho et al. | 257/676 |
| 2006/0244157 | A1 * | 11/2006 | Carson | 257/787 |
| 2007/0093000 | A1 * | 4/2007 | Shim et al. | 438/123 |
| 2008/0093717 | A1 * | 4/2008 | Huang et al. | 257/673 |
| 2008/0224284 | A1 * | 9/2008 | Wu et al. | 257/673 |
| 2009/0166822 | A1 * | 7/2009 | Camacho et al. | 257/670 |
| 2009/0243082 | A1 | 10/2009 | Camacho et al. | |
| 2010/0052131 | A1 * | 3/2010 | Tay et al. | 257/686 |
| 2010/0072590 | A1 * | 3/2010 | Liu et al. | 257/676 |

* cited by examiner

*Primary Examiner* — Steven Loke
*Assistant Examiner* — David Goodwin
(74) *Attorney, Agent, or Firm* — Ishimaru & Associates LLP

(57) ABSTRACT

An integrated circuit packaging system and method of manufacture thereof includes: leads and a paddle; a first encapsulant molded between the leads and the paddle, the first encapsulant thinner than the leads; a non-conductive layer over the paddle; and conductive traces directly on the leads, the first encapsulant, and the non-conductive layer.

20 Claims, 5 Drawing Sheets

US 8,420,447 B2

INTEGRATED CIRCUIT PACKAGING SYSTEM WITH FLIPCHIP LEADFRAME AND METHOD OF MANUFACTURE THEREOF

TECHNICAL FIELD

The present invention relates generally to an integrated circuit packaging system, and more particularly to a system for providing a leadframe for a flipchip.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Different challenges arise from increased functionality integration and miniaturization. For example, a semiconductor product having increased functionality may be made smaller but may still be required to provide a large number of inputs/outputs (I/O). The semiconductor product also needs to be readily testable while still providing smaller size. Further, increased performance of semiconductor product put additional challenges on the semiconductor product during test and in the field.

Among the problems caused by size reduction is the difficulty of accommodating a flip chip, a chip having solder ball electrical interconnects, that is very small to a leadframe.

Further, it is even more difficult to attach even more than one flip chip to a leadframe.

Still further, it is more difficult to stack different types of chips onto a flip chip on a leadframe.

Thus, a need still remains for an integrated circuit packaging system providing low cost manufacturing, improved yield, improved reliability, and improved testability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a leadframe including leads and a paddle; molding a first encapsulant in the leadframe between the leads and the paddle, the first encapsulant thinner than the leads; forming a non-conductive layer over the paddle; and forming conductive traces directly on the leads, the first encapsulant, and the non-conductive layer.

The present invention provides an integrated circuit packaging system including: leads and a paddle; a first encapsulant molded between the leads and the paddle, the first encapsulant thinner than the leads; a non-conductive layer over the paddle; and conductive traces directly on the leads, the first encapsulant, and the non-conductive layer.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
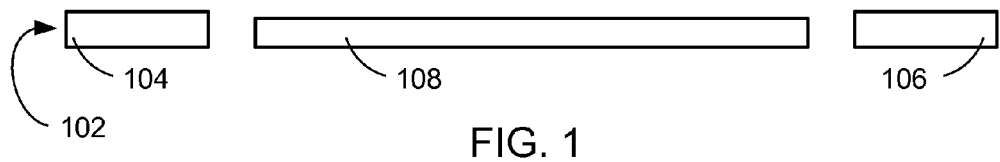
FIG. 1 is a cross-section of a rectangular integrated circuit packaging system in an initial stage of manufacture in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-section of a rectangular integrated circuit packaging system in an initial stage of manufacture in an embodiment of the present invention.

A leadframe 102 is generally one piece and forms the base upon which the integrated circuit packaging systems are built until singulation of the individual integrated circuit packaging systems. The leadframe 102 includes leads 104 and 106. The leadframe 102 further includes at least one paddle 108. The paddle 108 can be the same vertical thickness as the leads 104 and 106 or can be slightly thinner.

Figure 2:
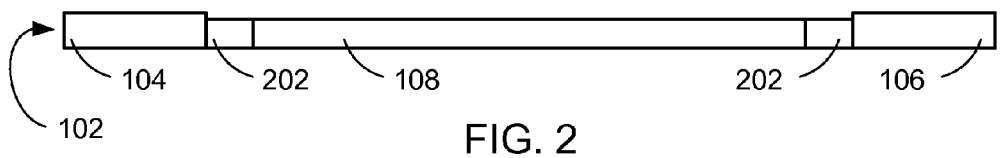
FIG. 2 is the structure of FIG. 1 in a molding stage.

Referring now to FIG. 2, therein is shown the structure of FIG. 1 in a molding stage.

The leadframe 102 has a first encapsulant 202 molded between the leads 104 and 106 and the paddle 108. The first encapsulant 202 is approximately the same thickness as the paddle 108 and has top and bottom surfaces substantially coplanar with the top and bottom surfaces of the paddle 108.

The first encapsulant 202 can be a liquid molding compound or a compression molding material which is injection molded between the leads 104 and 106 and the paddle 108.

Figure 3:
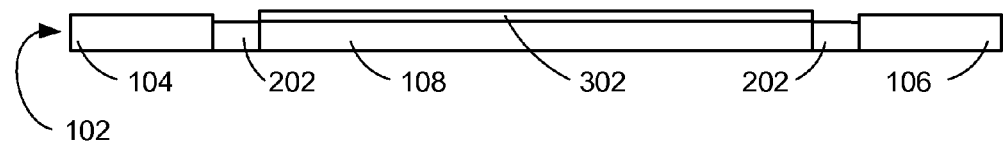
FIG. 3 is the structure of FIG. 2 in a non-conductive layer forming stage.

Referring now to FIG. 3, therein is shown the structure of FIG. 2 in a non-conductive layer forming stage.

A patterned masking layer (conventional and not shown) has been placed on the leadframe 102 which exposes the paddle 108 for placement of a non-conductive layer 302. The non-conductive layer 302 may be plated on the paddle 108 and may be of a material such as B-stage printable paste material (e.g., Ablestik Ablebond® 8006NS from Henkel AG & Co. KGaA of Dusseldorf, Germany), common passivation (polyimide) materials (e.g., silicon nitride), or solder mask materials (e.g., as used with bismaleimide-triazine laminates used in ball grid array packages.)

After placement of the non-conductive layer 302, the masking is removed.

Figure 4:
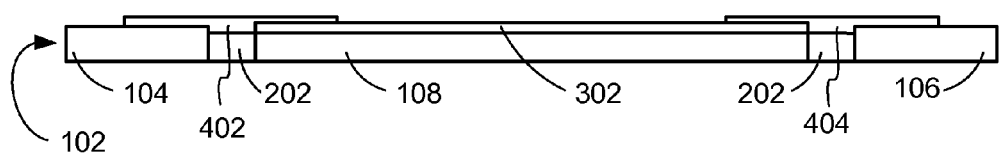
FIG. 4 is the structure of FIG. 1 after a masking and trace formation process with removal of the masking.

Referring now to FIG. 4, therein is shown the structure of FIG. 1 after a masking and trace formation process with removal of the masking.

A second patterned masking layer (conventional and not shown) has been placed on the leadframe 102, the first encapsulant 202, and the non-conductive layer 302 with a pattern allowing the deposition of conductive traces 402 and 404 each include a side, the side directly on the leads 104 and 106, the first encapsulant 202, and the non-conductive layer 302. The conductive traces 402 and 404 are of copper and are conductively connected to the leads 104 and 106, respectively.

The masking layer has been subsequently removed.

Figure 5:
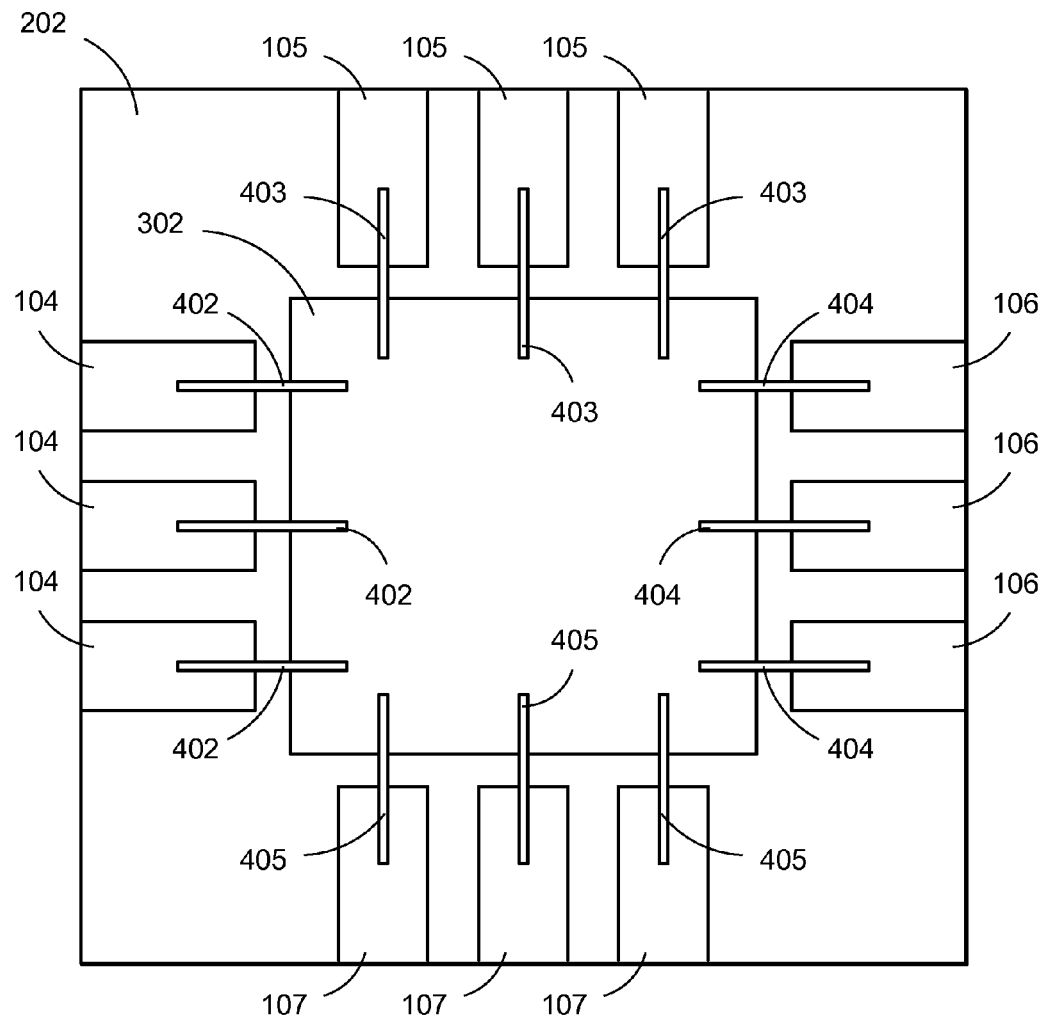
FIG. 5 is a plan view of FIG. 4.

Referring now to FIG. 5, therein is shown a plan view of FIG. 4. The first encapsulant 202 separates the leads 104 and 106, and leads 105 and 107 from the paddle 108 of FIG. 1 (hidden by the non-conductive layer 302).

The conductive traces 402 extend over the leads 104 and the first encapsulant 202 to the non-conductive layer 302. The conductive traces 404 extend from the leads 106 over the first encapsulant 202 to the non-conductive layer 302. Conductive traces 403 extend from the leads 105 over the first encapsulant 202 to the non-conductive layer 302. Conductive traces 405 extend from the leads 107 over the first encapsulant 202 to the non-conductive layer 302. The conductive traces 402-405 are similar to the conductive lines printed on printed circuit boards and are extremely thin in both horizontal and vertical directions compared to the thickness of the leads 104-107.

Figure 6:
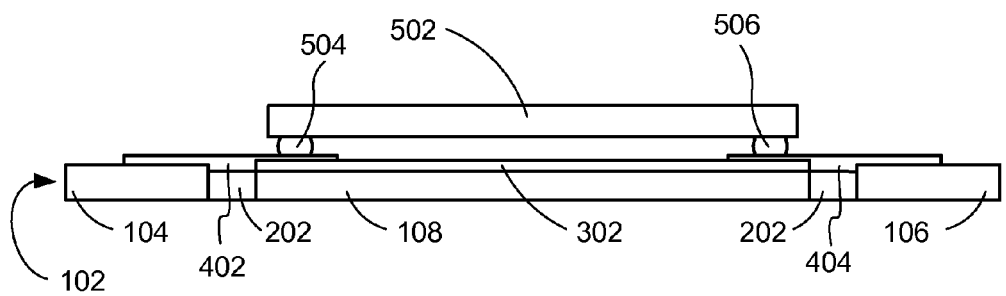
FIG. 6 is the structure of FIG. 4 after conductive bonding of a first module.

Referring now to FIG. 6, therein is shown the structure of FIG. 4 after conductive bonding of a first module.

A first module 502 may be an individual die or package of one or more dies with or without a substrate and packaged in an encapsulant. The first module 502 is shown as a flip chip die having solder balls 504 and 506 is conductively bonded to the conductive traces 402 and 404 over the non-conductive layer 302.

It has been discovered that by using the conductive traces 402 and 404 over the non-conductive layer 302 and first encapsulant 202 that it is possible to connect a very small flip chip die to the larger structure of the leadframe 102 and the leads 104 and 106.

Figure 7:
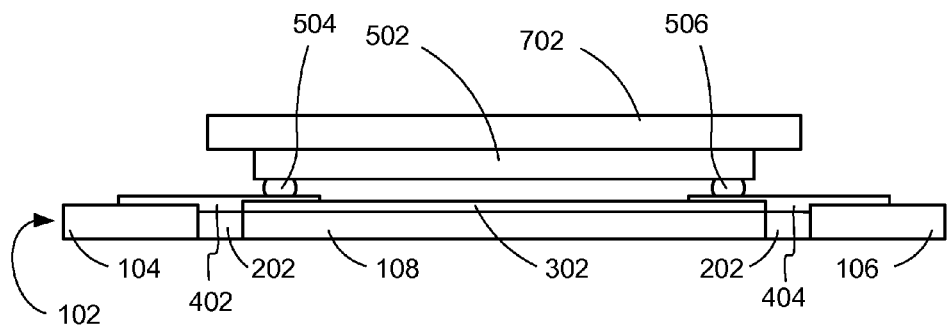
FIG. 7 is an alternate embodiment of the present invention with a structure similar to FIG. 6 having a second module stacked on a first module.

Referring now to FIG. 7, therein is shown an alternate embodiment of the present invention with a structure similar to FIG. 6 having a second module stacked on a first module.

A second module 702 is attached to the first module 502. The second module 702 may be an individual die or package of one or more dies with or without a substrate and packaged in an encapsulant.

Figure 8:
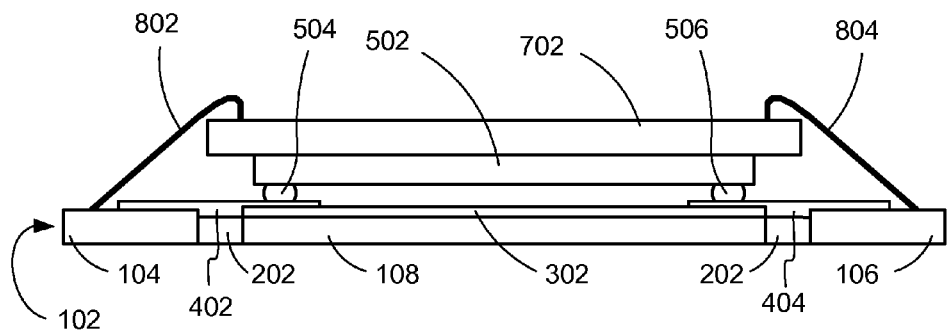
FIG. 8 is the structure of FIG. 7 having the second module connected to the leads.

Referring now to FIG. 8, therein is shown the structure of FIG. 7 having the second module connected to the leads.

The second module 702 is larger than the first module 502 and could be a flip chip die but is shown as a wire bond die that is wire bonded by bond wires 802 and 804 that conductively connect the second module 702 to the leads 104 and 106, respectively.

It should be noted that the first module 502 is smaller than the second module 702, which is still smaller than the distance between the leads 104 and 106.

Figure 9:
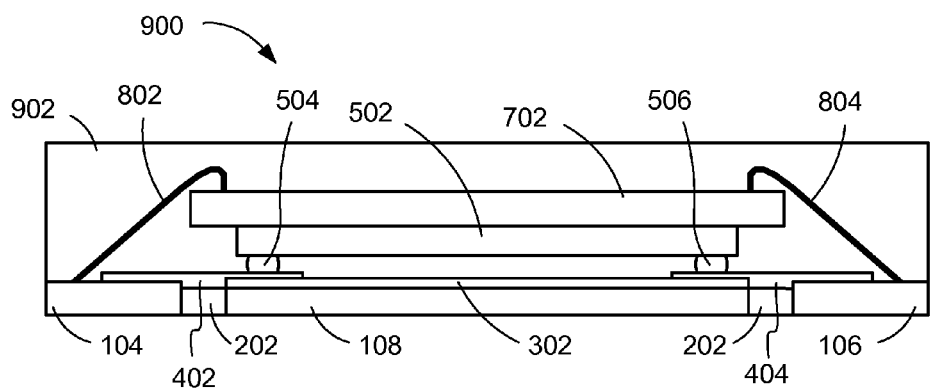
FIG. 9 is the structure of FIG. 8 after encapsulation.

Referring now to FIG. 9, therein is shown the structure of FIG. 8 after encapsulation.

A second encapsulant 902 encapsulates the conductive traces 402 and 404, the first module 502, the second module 702, and the bond wires 802 and 804. The leadframe 102 of FIG. 1 has been removed during singulation and the leads 104 and 106 are separated from each other to form an integrated circuit packaging system 900.

Figure 10:
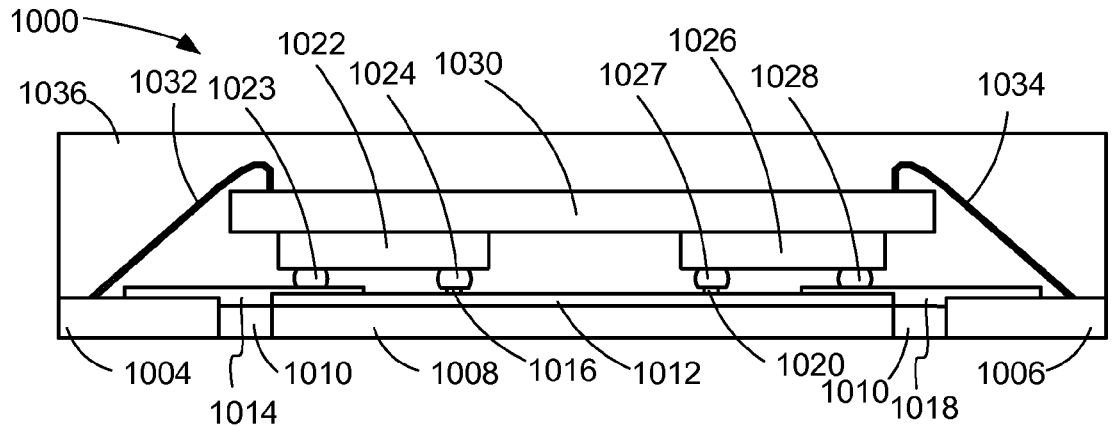
FIG. 10 is another alternate embodiment of the present invention having more than one module.

Referring now to FIG. 10, therein is shown another alternate embodiment of the present invention having more than one module.

An integrated circuit packaging system 1000 has leads 1004 and 1006, and a paddle 1008, molded in a first encapsulant 1010. A non-conductive layer 1012 is deposited on the paddle 1008.

Conductive traces 1014, 1016, 1018, and 1020 are deposited on at least the leads 1004 and 1006, the first encapsulant 1010, and the non-conductive layer 1012.

A first flip chip module 1022 having solder balls 1023 and 1024 are respectively bonded to the conductive traces 1014 and 1016. A second flip chip module 1026 having solder balls 1027 and 1028 are respectively attached to the conductive traces 1020 and 1018.

A third module 1030 is attached to the first and second flip chip modules 1022 and 1026 and wire bonded by bond wires 1032 and 1034 respectively to the leads 1004 and 1006.

A second encapsulant 1036 encapsulates all structures above the first encapsulant 1010 to form the integrated circuit packaging system 1000.

Figure 11:
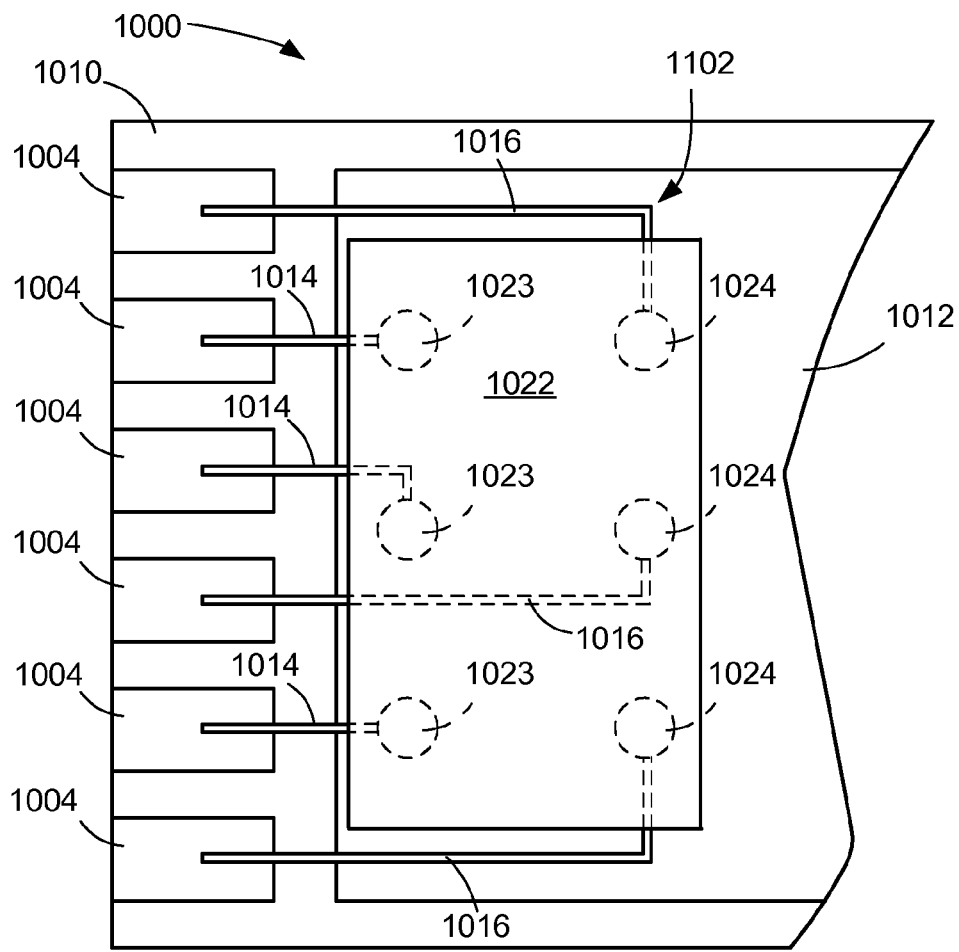
FIG. 11 is a partial plan view of a portion of FIG. 10.

Referring now to FIG. 11, therein is shown a partial plan view of a portion of FIG. 10. The first flip chip module 1022 is shown with the third module 1030, the bond wires 1032, and the second encapsulant 1036 of FIG. 10 removed.

The conductive traces 1014, 1016, 1018, and 1020 may be deposited in various configurations of straight or with one or more bends. For example, the conductive traces 1016 have bends 1102. The bends 1102 can be at any angle and may appear in different locations along the length of the conductive traces 1016 before being conductively connected to the solder balls 1024.

The bends 1102 may appear over the leads 1004, the first encapsulant 1010, or the non-conductive layer 1012.

Figure 12:
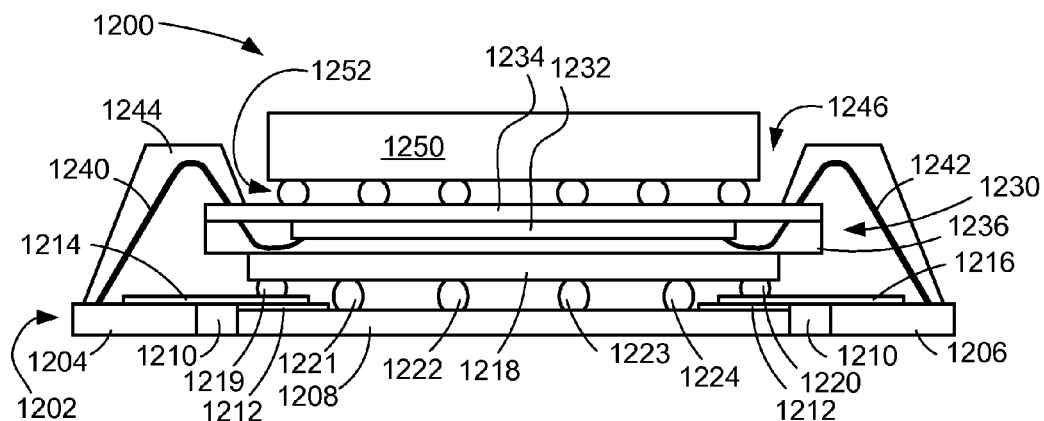
FIG. 12 is a further alternate embodiment of the present invention with further additional modules.

Referring now to FIG. 12, therein is shown a further alternate embodiment of the present invention with further additional modules.

An integrated circuit packaging system 1200 has a leadframe 1202 with package leads 1204 and 1206, and a paddle 1208, embedded in a first encapsulant 1210. A non-conductive layer 1212 is deposited on the paddle 1208 as a rectangular ring with the top surface of the paddle 1208 exposed through the center of the rectangular ring.

Conductive traces 1214 and 1216 are deposited at least on the package leads 1204 and 1206, the first encapsulant 1210, and the non-conductive layer 1212.

A first flip chip module 1218 has solder balls 1219 and 1220 conductively connected to the conductive traces 1214 and 1216, respectively. The first flip chip module 1218 further has solder balls 1221-1224 conductively connected to the paddle 1208 through the rectangular opening in the non-conductive layer 1212 to provide thermal and ground connections for the first flip chip module 1218.

A second module 1230 is attached to the first flip chip module 1218. The second module 1230 includes a die 1232 wire bonded to a substrate 1234 and encapsulated in a package encapsulant 1236. The substrate 1234 of the second module 1230 is wire bonded by package bond wires 1240 and 1242 respectively to the package leads 1204 and 1206.

A configured encapsulant 1244 encapsulates the first flip chip module 1218 and a portion of the second module 1230. The configured encapsulant 1244 is considered configured because it is configured to protect the package bond wires 1240 and 1242 while exposing a portion of the substrate 1234 through a cavity 1246.

The cavity 1246 in the configured encapsulant 1244 allows for conductive bonding of a second flip chip module 1250 having solder balls 1252 to the substrate 1234.

It has been discovered that the stacking of the modules and the configured encapsulant 1244 allow an extremely compact stacking arrangement of various modules that are smaller than the distance between the leads 1204 and 1206.

Figure 13:
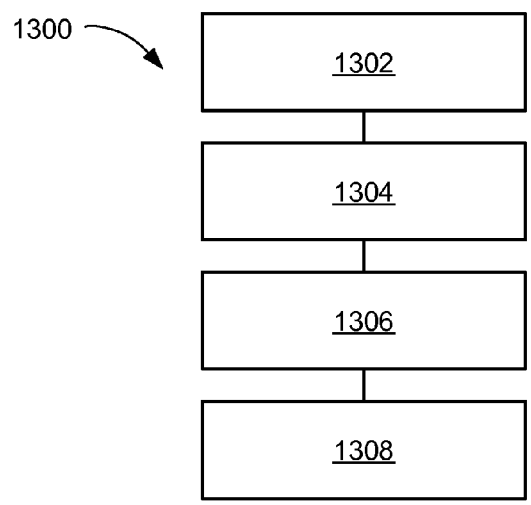
FIG. 13 is a flow chart of a method of manufacturing an integrated circuit packaging system in an embodiment of the present invention.

Referring now to FIG. 13, therein is shown a flow chart of a method of manufacturing an integrated circuit packaging system in an embodiment of the present invention. The method 1300 of manufacture includes: forming a leadframe including leads and a paddle in a block 1302; molding a first encapsulant in the leadframe between the leads and the paddle, the first encapsulant thinner than the leads in a block 1304; forming a non-conductive layer over the paddle in a block 1306; and forming conductive traces directly on the leads, the first encapsulant, and the non-conductive layer in a block 1308.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a leadframe including leads and a paddle;
   molding a first encapsulant in the leadframe between the leads and the paddle, the first encapsulant thinner than the leads;
   forming a non-conductive layer over the paddle; and
   forming conductive traces each having a side, the side directly on the lead, the first encapsulant, and the non-conductive layer.

2. The method as claimed in claim 1 further comprising:
   attaching a first module to the conductive traces; and
   encapsulating the first module in a second encapsulant.

3. The method as claimed in claim 1 wherein:
   forming the non-conductive layer forms the non-conductive layer with an opening therein over a portion of the paddle; and
further comprising:
   conductively bonding a first module to the conductive traces on the non-conductive layer and to the paddle through the opening in the non-conductive layer.

4. The method as claimed in claim 1 further comprising:
   conductively bonding a first module to the conductive traces;
   attaching a second module to the first module;
   conductively bonding the second module to the leads; and
   further encapsulating the first module and the second module in a second encapsulant.

5. The method as claimed in claim 1 further comprising:
   conductively bonding a first module to the conductive traces;
   attaching a second module to the first module, the second module having a substrate conductively connected to the leads;
   further encapsulating the second module in a configured encapsulant exposing an exposed portion of the substrate; and
   conductively bonding a third module to the exposed portion of the substrate.

6. A method of manufacture of an integrated circuit packaging system comprising:
   forming a leadframe including leads and a paddle;
   molding a first encapsulant in the leadframe between the leads and the paddle, the first encapsulant coplanar with the top and bottom surfaces of the paddle;
   forming a non-conductive layer over the paddle;
   forming straight or bent conductive traces each having a side, the side directly on the lead, the first encapsulant, and the non-conductive layer; and
   separating the leads from each other.

7. The method as claimed in claim 6 further comprising:
conductively bonding a flip chip module to the conductive traces; and
further encapsulating the flip chip module in a second encapsulant.

8. The method as claimed in claim 6 wherein:
forming the non-conductive layer forms the non-conductive layer with an opening therein over a portion of the paddle; and
further comprising:
conductively bonding a flip chip module to the conductive traces on the non-conductive layer and to the paddle through the opening in the non-conductive layer.

9. The method as claimed in claim 6 further comprising:
conductively bonding a flip chip module to the conductive traces;
attaching a wire bond module to the flip chip module;
wire bonding the wire bond module to the leads; and
further encapsulating the flip chip module and the wire bond module in a second encapsulant.

10. The method as claimed in claim 6 further comprising:
conductively bonding a flip chip module to the conductive traces;
attaching a wire bond module to the flip chip module, the wire bond module having a substrate conductively connected to the leads;
encapsulating the wire bond module in a configured encapsulant exposing an exposed portion of the substrate; and
bonding a further flip chip module to the exposed portion of the substrate.

11. An integrated circuit packaging system comprising:
leads
a paddle;
a first encapsulant molded between the leads and the paddle, the first encapsulant
thinner than the leads;
a non-conductive layer over the paddle; and
conductive traces each having a side, the side directly on the lead, the first encapsulant, and the non-conductive layer.

12. The system as claimed in claim 11 further comprising:
a first module attached to the conductive traces; and
a second encapsulant encapsulating the first module.

13. The system as claimed in claim 11 wherein:
the non-conductive layer has an opening therein over a portion of the paddle; and
further comprising:
a first module conductively bonded to the conductive traces on the non-conductive layer and to the paddle through the opening in the non-conductive layer.

14. The system as claimed in claim 11 further comprising:
a first module conductively bonded to the conductive traces;
a second module attached to the first module;
bonds conductively bonding the second module to the leads; and
a second encapsulant encapsulating the first module and the second module.

15. The system as claimed in claim 11 further comprising:
a first module conductively bonded to the conductive traces;
a second module attached to the first module, the second module having a substrate conductively connected to the leads;
a configured encapsulant encapsulating the second module and exposing an exposed portion of the substrate; and
third module conductively bonded to the exposed portion of the substrate.

16. The system as claimed in claim 11 wherein:
the first encapsulant is coplanar with the top and bottom surfaces of the paddle; and
the conductive traces are straight or bent on the first encapsulant or the non-conductive layer.

17. The system as claimed in claim 16 further comprising:
a flip chip module conductively bonded to the conductive traces; and
a second encapsulant encapsulating the flip chip module.

18. The system as claimed in claim 16 wherein:
the non-conductive layer has an opening therein over a portion of the paddle; and
further comprising
a flip chip module conductively bonded to the conductive traces on the non-conductive layer and to the paddle through the opening in the non-conductive layer.

19. The system as claimed in claim 16 further comprising:
a flip chip module conductively bonded to the conductive traces;
a wire bond module attached to the flip chip module;
bond wires conductively connecting the wire bond module to the leads; and
a second encapsulant encapsulating the wire bond module and the flip chip module.

20. The system as claimed in claim 16 further comprising:
a flip chip module attached to the conductive traces;
a wire bond module attached to the flip chip module and having a substrate conductively connected to the leads;
a configured encapsulant encapsulating the wire bond module and exposing a portion of the substrate; and
a further flip chip module bonded to the exposed portion of the substrate.

* * * * *